United States Patent [19]

Malwah

[11] 4,380,113
[45] Apr. 19, 1983

[54] PROCESS FOR FABRICATING A HIGH CAPACITY MEMORY CELL

[75] Inventor: Manohar L. Malwah, Sunnyvale, Calif.

[73] Assignee: Signetics Corporation, Sunnyvale, Calif.

[21] Appl. No.: 207,275

[22] Filed: Nov. 17, 1980

[51] Int. Cl.³ .......................................... H01L 29/78
[52] U.S. Cl. ............................ 29/577 C; 29/576 B; 29/571; 29/578; 148/191
[58] Field of Search ...................... 357/23 C, 59, 41; 29/571, 577 C, 578, 576 B; 148/1.5, 191

[56] References Cited

U.S. PATENT DOCUMENTS

| | | | |
|---|---|---|---|
| 3,203,840 | 8/1965 | Harris | 148/191 |
| 3,897,625 | 8/1975 | Tihanyi et al. | 29/571 |
| 4,035,906 | 6/1977 | Tasch et al. | 29/589 X |
| 4,167,017 | 9/1979 | Tasch, Jr. et al. | 357/59 X |
| 4,227,202 | 10/1980 | Tasch, Jr. et al. | 357/59 X |
| 4,228,445 | 10/1980 | Tasch, Jr. et al. | 357/59 X |

Primary Examiner—L. Dewayne Rutledge
Assistant Examiner—David Hey
Attorney, Agent, or Firm—Jerry A. Dinardo; Robert T. Mayer; Jack Oisher

[57] ABSTRACT

A method of fabricating an array of high capacity memory cells comprises patterning a semiconductor surface to form memory cell areas; covering the memory cell areas with insulator; forming an ion layer of first conductivity type throughout the insulator; forming an ion layer of second conductivity type throughout the semiconductor surface; forming a first conductive pattern over the insulating layer to form a storage gate and to define a storage region extending to an isolation region and to define a transfer region spaced from the isolation region by the storage region; removing ions of first conductivity type from the portion of insulator above the transfer region and from other active areas; removing ions of second conductivity type from the transfer region and other active areas; diffusing ions of first conductivity type from the insulating layer to the storage region to produce in the storage region a shallow ion layer of first conductivity type and a deep ion layer of second conductivity type; and forming a second conductive pattern over the transfer region to define a bit line region spaced from the storage region by a portion of the transfer region and to produce a transfer gate overlying the transfer region portion and also insulated from and partially overlying the storage gate.

9 Claims, 7 Drawing Figures

PROCESS FOR FABRICATING A HIGH CAPACITY MEMORY CELL

BACKGROUND OF THE INVENTION

This invention relates to memory cells for random access memories and particularly to an improved process for fabricating a memory cell of the kind comprising a single transistor.

The single transistor RAM cell comprises a storage capacitor and a MOS transistor. The storage capacitor lies in a storage region of a semiconductor surface and the transistor lies next to the storage region in a transfer region of the semiconductor surface. The drain of the MOS transistor lies within the storage region.

It is known that the storage capacitance of a single transistor dynamic RAM cell includes a parallel combination of oxide capacitance and depletion capacitance. Such a memory cell is called a high capacity memory cell. In the storage region of the cell the depletion capacitance is enhanced by introducing a shallow ion layer and a deep ion layer one above the other. The shallow ion layer includes majority carriers of a first conductivity type opposite that of the substrate, and the deep ion layer includes majority carriers of a second conductivity type opposite that of the shallow ion layer and the same as that of the substrate. Thus, for a P type substrate the shallow ion layer can be formed by introducing N type ions or donors and the deep ion layer can be formed by introducing P type ions or acceptors below the shallow ion layer. A high capacity cell and several methods of fabricating such a cell is disclosed in U.S. Pat. No. 4,112,575 to FU et al.

In fabricating a high capacity dynamic RAM cell it is important to avoid potential barriers at the interface between the storage and transfer regions, which would tend to reduce the charge capacity of the cell. Furthermore, there is a need for a simplified process of fabricating the memory cell.

SUMMARY OF THE INVENTION

A method of fabricating an array of high capacity memory cells comprises forming isolation regions on the surface of a semiconductor substrate which are patterned to produce a multiplicity of cell areas. An insulating layer is formed over the entire surface of the cell areas. Ions having majority carriers of first conductivity type are introduced throughout the insulating layer. Ions of second conductivity type opposite the first conductivity type are introduced throughout the semiconductor surface area. A pattern of conductive material is formed over the insulating layer to form a storage gate and to define a storage region beneath the storage gate extending to an isolation region and to define a transfer region spaced from the isolation region by the storage region.

Ions having majority carriers of the first conductivity type are removed from the portion of the insulating layer above the storage region. Ions having majority carriers of the second conductivity type are removed from the transfer region. Ions having majority carriers of the first conductivity type are diffused from the insulating layer to the storage region to produce in the storage region a shallow ion layer having majority carriers of the first conductivity type and beneath the shallow ion layer a deep ion layer having majority carriers of the second conductivity type. Both ion layers are self-aligned with the storage gate. A pattern of conductive material is formed over the transfer region to define a bit line region spaced from the storage region by a portion of the transfer region and to produce a transfer gate overlying the transfer region portion and also insulated from a partially overlying storage gate.

DETAILED DESCRIPTION OF THE PREFERRED EMBODIMENT

Figure 1:
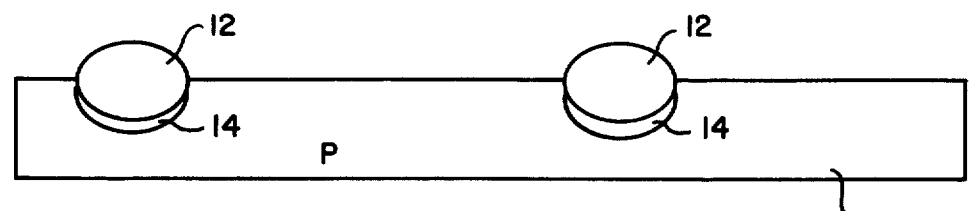
FIGS. 1-7 are cross-sectional views of a memory cell illustrating the various stages of the process according to the invention.

Referring now to FIG. 1, there will be described a process for fabricating a one transistor high capacity dynamic RAM cell. The specific description is for an N channel device but the principles are applicable to a P channel device with suitable modification of the conductivity types for the substrate and the impurity ions. In FIG. 1, a surface of a P type semiconductor substrate 10 is provided with isolation regions comprising field oxide regions 12 and channel stop regions 14 to produce an array of cell areas between the isolation regions. The field oxide regions 12 may be produced by selective oxidation treatment of a silicon semiconductor substrate surface using silicon nitride as a mask. The thickness of the field oxide regions 12 is about 8000 angstroms. The channel stop regions 14 have the same conductivity type as the substrate and may be produced by implanting boron ions with a sufficient energy and dosage to produce the desired channel stop threshold.

Figure 2:
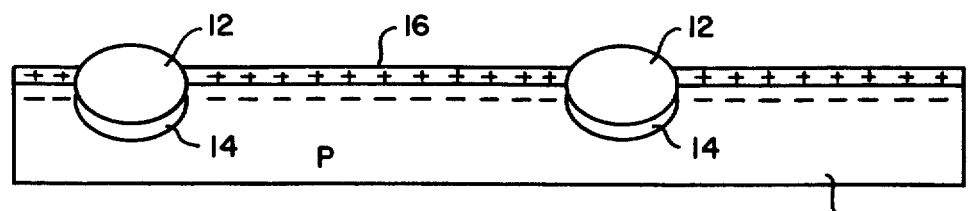

In FIG. 2, the entire surface of the semiconductor substrate 10 is covered with a gate oxide layer 16 for the charge storage regions. The gate oxide layer 16 may be a thermally grown oxide layer using either steam or dry oxygen hydrogen chloride gas ambient. The thickness of the gate oxide layer 16 is in the range of about 450-600 angstroms. After the oxide layer 16 is formed, boron ions are implanted in the substrate surface and arsenic ions are imlanted in the oxide layer 16. The energy of the boron ions is adjusted such that the implant peak is in the silicon near the interface of the silicon and silicon oxide. The energy of the arsenic ions is adjusted so that the implant is confined within the gate oxide layer 16. For example, if the gate oxide layer 16 is 500 angstroms thick, boron and arsenic ion energies are 18 Kev and 20 Kev, respectively.

Figure 3:
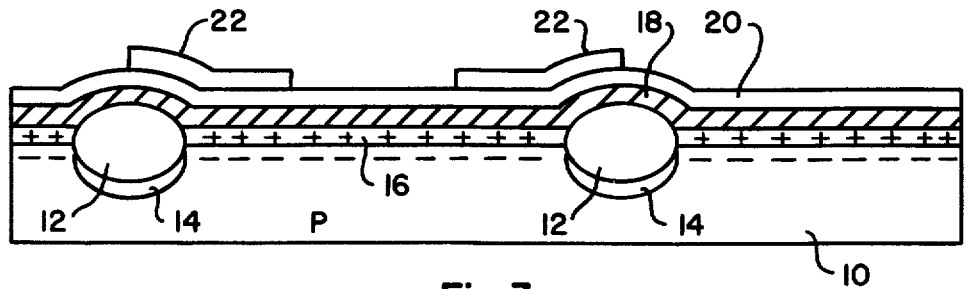

As shown in FIG. 3, the next step comprises depositing a layer 18 of LPCVD polysilicon on the oxide layer 16. The polysilicon layer is doped N type, such as with phosphorus, and may be about 0.5 microns thick. The polysilicon layer 18 is covered with a layer 20 of LPCVD deposited silicon oxide of about 2500 angstroms thickness. LPCVD means low pressure chemical vapor deposition.

Figure 4:
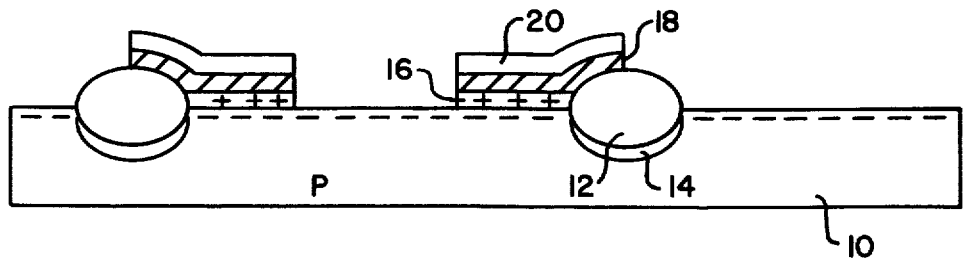

In the next series of processing steps, the silicon oxide-polysilicon-silicon oxide sandwich is masked with photoresist 22 in the storage regions and the layers of the silicon oxide-polysilicon-silicon oxide sandwich are removed from the remaining unmasked regions. Removal of the unmasked portions of the layers 16, 18, 20 can be achieved either by wet chemical or by plasma etching means. FIG. 4 shows the structure at the stage following the removal of the photoresist 22. The sandwich comprising silicon oxide layer 16, polysilicon layer 18, and silicon oxide layer 20 is present in the storage regions only, and the oxide layer 16 doped with N type impurity ions has been removed in all other regions.

Figure 5:
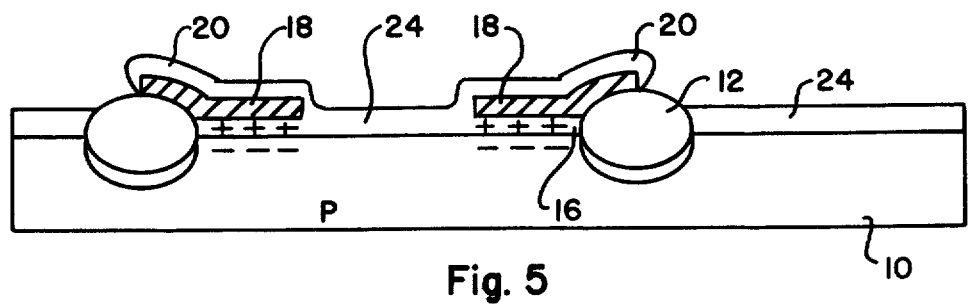

Referring now to FIG. 5, a second gate oxide layer 24 is grown covering the bare surface of the substrate 10, using a low temperature, about 850° C., wet oxidation cycle. During this step additional oxide is permitted to grow on the doped oxide layer 20. The thickness of the second gate oxide layer 24 is approximately 750 angstroms. During this step of oxide growth the active semiconductor regions exclusive of the storage region sandwich including layers 16, 18, 20 are depleted of boron ions, which now segregate into the second gate oxide layer 24. Approximately 97% of the P type impurity boron ions diffuse from the semiconductor surface into the second gate oxide layer 24. At this stage then, there are in the storage region arsenic or N type ions in the first gate oxide layer 16 and boron or P type ions in the semiconductor substrate 10, and boron ions have been depleted from the remaining areas of the silicon surface.

Figure 6:
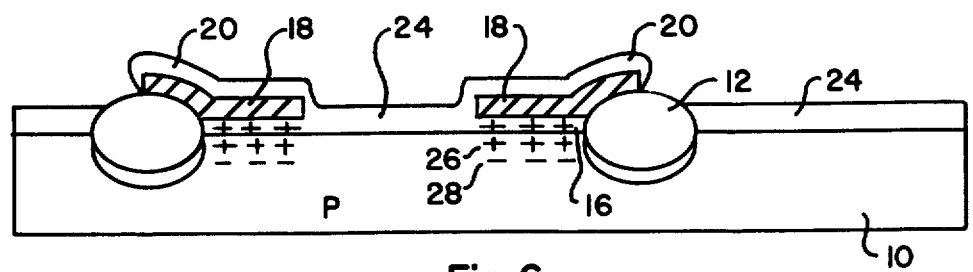

The next step in the process is shown in FIG. 6 and comprises placing the wafers in an argon ambient at a temperature of 1050° C. for about 60 minutes. During this heat treatment, N type arsenic ions diffuse from the first gate oxide layer 16 into the silicon substrate 10 in the storage regions, and the P type boron ions are driven deeper into the silicon in those regions. In the semiconductor surface of the storage regions, now, the arsenic ions constitute a shallow ion layer 26 of majority carriers of first conductivity type and the boron ions constitute a deep ion layer 28 of majority carriers of second conductivity type. The ions of the shallow and deep layers are confined to the storage region of the semiconductor.

Figure 7:
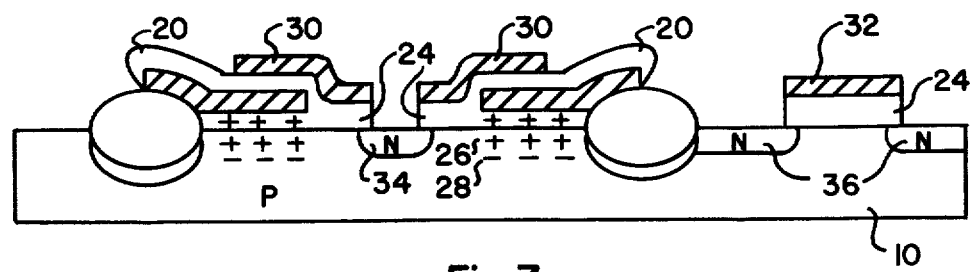

The succeeding steps in the process are shown in FIG. 7 and follow standard N-channel silicon gate processing. A second polysilicon layer is deposited over the oxide layer 20 and 24 and patterned to produce in the transfer region lying between the storage regions two laterally spaced transfer gates 30, and also to produce in the peripheral region outside the cell areas a peripheral transistor gate 32. Each transfer gate 30 overlaps on one side a portion of the polysilicon layer 18 which constitutes the storage gate. In the region between the transfer gates 30, the second gate oxide 24 is removed and an N type implant, such as arsenic, is performed to produce a bit line region 34 in the semiconductor surface of the substrate 10. The bit line region 34 also serves as the source region of the transfer device, and the portion of the storage region comprising the ion layers 26 and 28 also serves as the drain region of the transfer device.

In the peripheral transistor region, the second gate oxide 24 is removed from spaced apart regions on opposite sides of the peripheral transistor gate 32 and an N type implant is performed to produce source and drain regions 36 of the peripheral transistor. This implant can be performed simultaneously with the one that produces that bit line region 34.

In each cell area shown in FIG. 7 there are produced two storage devices and two transfer devices. The bit line region 34 serves as a source for each of the transfer devices on either side of it, and each of the storage capacitor regions also contains within it the drain for one of the transfer devices.

What is claimed is:
1. A method of fabricating a high capacity memory cell, comprising:

(a) forming isolation regions in a surface of a semiconductor substrate patterned to produce a multiplicity of cell areas;
(b) forming an insulating layer over the entire surface of said cell areas;
(c) introducing ions having majority carriers of first conductivity type throughout the entire area of said insulating layer;
(d) introducing ions having majority carriers of second conductivity type opposite said first conductivity type throughout the entire area of the semiconductor surface.
(e) forming a first pattern of conductive material over said insulating layer to form a storage gate and to define a storage region beneath said storage gate extending to an isolation region and to define a transfer region spaced from said isolation region by said storage region;
(f) removing said insulating layer from the portion lying above said transfer region and from other active areas to selectively remove ions having majority carriers of said first conductivity type;
(g) removing ions having majority carriers of said second conductivity type from said transfer region and other active areas by forming an oxide layer on the semiconductor surface where said insulating layer is removed;
(h) diffusing ions having majority carriers of said first conductivity type from said insulating layer to said storage region to produce in said storage region a shallow ion layer having majority carriers of said first conductivity type and beneath said shallow ion layer a deep ion layer having majority carriers of said second conductivity type; and
(i) forming a second pattern of conductive material over said transfer region to define a bit line region spaced from said storage region by a portion of said transfer region and to produce a transfer gate overlying said transfer region portion and also insulated from and partially overlying said storage gate.

2. The invention according to claim 1, wherein said substrate comprises second conductivity type material.

3. The invention according to claim 2 wherein said substrate comprises P type conductivity material.

4. The invention according to claim 1, wherein said second pattern of conductive material forms two transfer gates in each cell area that are spaced apart by a single bit line region, with each transfer gate spaced from an isolation region by a storage region.

5. The invention according to claim 4, wherein said second pattern of conductive material extends over a peripheral region adjacent to a cell area and forms a peripheral transfer gate spaced from an isolation region to define regions on opposite sides thereof for the formation of source and drain.

6. The invention according to claim 5, and further including introducing impurities of first conductivity type after forming said second pattern of conductive material to produce a bit line between said two transfer gates and to produce a source and drain on opposite sides of said peripheral transfer gate.

7. The invention according to claim 1, wherein said semiconductor substrate is formed of silicon.

8. The invention according to claim 7, wherein the step of (g) is performed by growing oxide over the semiconductor surface where said insulating layer is removed utilizing a low temperature, wet oxidation cycle.

9. The invention according to claim 1, wherein said conductive material in (e) and (i) is polysilicon.

* * * * *